(12) United States Patent
Lim et al.

(10) Patent No.: US 11,527,485 B2
(45) Date of Patent: Dec. 13, 2022

(54) ELECTRICAL SHIELD FOR STACKED HETEROGENEOUS DEVICE INTEGRATION

(71) Applicant: Intel Corporation, Santa Clara, CA (US)

(72) Inventors: Seok Ling Lim, Kedah (MY); Bok Eng Cheah, Pinang (MY); Jenny Shio Yin Ong, Pinang (MY); Jackson Chung Peng Kong, Pinang (MY); Kooi Chi Ooi, Pinang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/088,618

(22) Filed: Nov. 4, 2020

(65) Prior Publication Data
US 2022/0068833 A1 Mar. 3, 2022

(30) Foreign Application Priority Data
Aug. 27, 2020 (MY) .............................. PI2020004414

(51) Int. Cl.
*H01L 23/552* (2006.01)
*H01L 23/495* (2006.01)
*H01L 23/00* (2006.01)

(52) U.S. Cl.
CPC ...... *H01L 23/552* (2013.01); *H01L 23/49575* (2013.01); *H01L 24/97* (2013.01)

(58) Field of Classification Search
CPC .. H01L 23/552; H01L 23/49575; H01L 24/97
See application file for complete search history.

(56) References Cited

U.S. PATENT DOCUMENTS

2015/0021081 A1* 1/2015 Mitarai ................... H01L 23/15
29/846
2019/0139915 A1* 5/2019 Dalmia ................. H01L 23/552

* cited by examiner

*Primary Examiner* — Michele Fan
(74) *Attorney, Agent, or Firm* — Viering, Jentschura & Partner mbB

(57) ABSTRACT

The present disclosure relates to a semiconductor package that may include a substrate, an interposer coupled to the substrate, a shield frame including at least one frame recess and at least one opening positioned over the interposer, a conductive shield layer on the shield frame, and a plurality of components coupled to the interposer.

16 Claims, 6 Drawing Sheets

ELECTRICAL SHIELD FOR STACKED HETEROGENEOUS DEVICE INTEGRATION

CROSS-REFERENCE TO RELATED APPLICATIONS

This non-provisional application claims priority to Malaysian Patent Application No. PI2020004414, which was filed on Aug. 27, 2020, which is incorporated by reference herein in its entirety.

BACKGROUND

In typical 2.5 D/3D stacked die packaging systems, a stacked package includes a silicon interposer wherein power delivery decoupling capacitors are disposed far apart from stacked integrated circuit devices on a package substrate landside. Such designs often result in escalated power supply noise jitter and performance degradations.

Current solutions to mitigate extensive power loop inductance and associated signaling jitter include increased package and/or printed circuit board decoupling capacitors to suppress the power supply noise. However, increased decoupling passive components, e.g., capacitors, consume additional package and/or platform real estate, thereby inhibiting device miniaturization.

Further, for platform miniaturization of heterogeneous devices, communication devices such as radio frequency integrated circuit (RFIC) and WIFI devices are arranged adjacent core processing devices, e.g., a central processing unit (CPU) or a graphic processing unit (GPU). Such designs often result in electromagnetic interference (EMI) and/or radio-frequency interference (RFI), collectively referred to as EMI, which can affect the operation of electronic circuitry.

Current solutions to mitigate EMI among devices in a computing system include increased device-to-device spacing, application of flexible EMI shield, or discrete package assembly for the communication devices. However, increased device-to-device spacing to circumvent EMI leads to lossy interconnects ascribed to increased conductor length and associated conductor resistance and skin-effects, thereby limiting channel transmission bandwidth.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
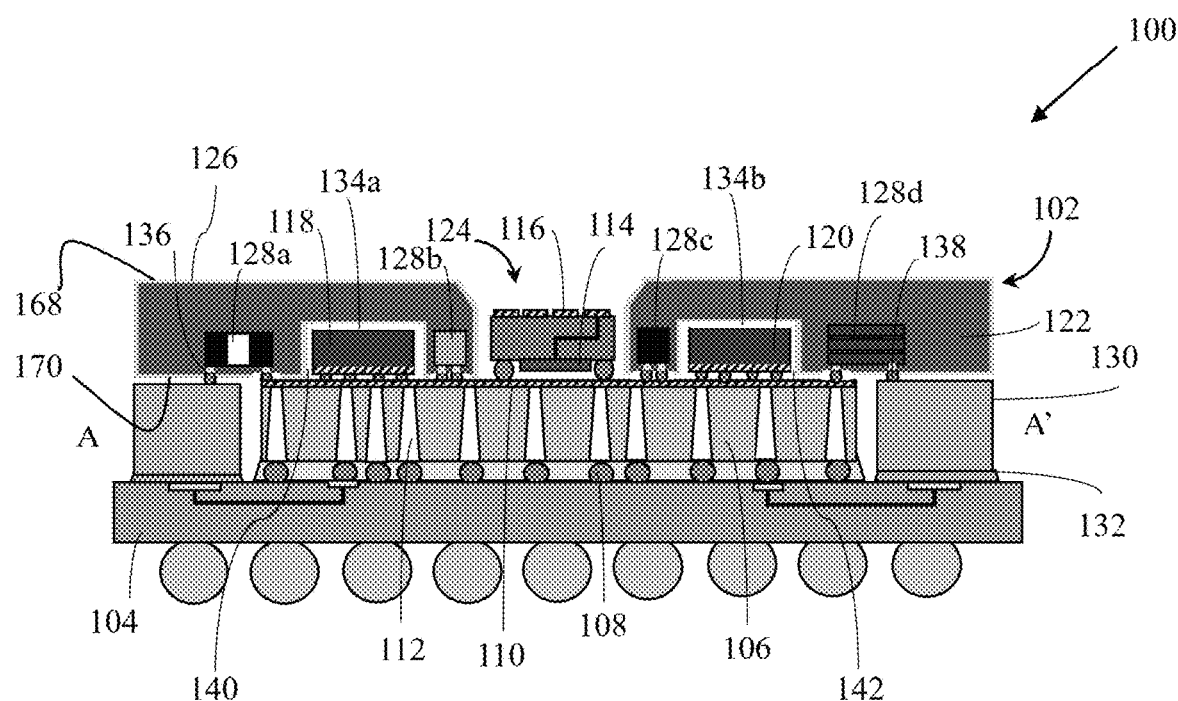
FIG. 1A shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a shielded semiconductor device or package. The semiconductor package may include a substrate, an interposer coupled to the substrate, a shield frame including at least one frame recess and at least one opening positioned over the interposer, a conductive shield layer on the shield frame, and a plurality of components coupled to the interposer.

In various aspects, the plurality of components may further include at least one recess component positioned in the frame recess, at least a first semiconductor device positioned in the opening, and at least one embedded component embedded in the shield frame.

In various aspects, the semiconductor package may include a frame support positioned adjacent to the interposer over the substrate, wherein the shield frame may be positioned over the interposer and the frame support.

The present disclosure also generally relates to a computing device. The computing device may include a circuit board and a semiconductor package coupled to the circuit board. The semiconductor package may include a substrate, an interposer coupled to the substrate, a shield frame including at least one frame recess and at least one opening positioned over the interposer, a conductive shield layer on the shield frame, and a plurality of components coupled to the interposer.

The present disclosure further generally relates to a method, e.g., a method for forming a shielded semiconductor device. The method may include forming a shield frame including at least one frame recess and at least one opening, forming a conductive shield layer on the shield frame, providing a substrate, coupling an interposer to the substrate, coupling a plurality of components to the interposer, and positioning the shield frame over the interposer to align the at least one frame recess and the at least one opening with the coupled plurality of components.

In various aspects, the method may further include forming a frame support positioned adjacent to the interposer over the substrate, wherein the shield frame may be positioned over the interposer and the frame support.

A technical effect or advantage of the present disclosure may include the realization of platform miniaturizations through increased device integration, e.g., platform controller hub (PCH), RFIC, field programmable gate array (FPGA) or dynamic random-access memory (DRAM) devices within a 2.5 D/3D stacked packaging system, package footprint miniaturization through reduction of "keep-out-zones" for passive component placement on package's landside, and increased package ball grid array input/output (BGA I/O) density.

Another technical effect or advantage of the present disclosure may include an improved signal integrity performance through shorter device-to-device transmission length and improved EMI and RFI shielding between stacked chiplet devices on the silicon interposer.

Yet another technical effect or advantage of the present disclosure may include an improved power integrity performance through reduced package inductance loop for highly integrated 2.5 D/3D stacked packaging system. In addition, the direct connection between the power delivery decoupling capacitor(s) and the associated power (Vcc) rail and ground (Vss) network across the stacked chiplet devices on the silicon interposer provides shorter loop inductance that improves the power delivery network (PDN) impedance performance and power supply noise jitter reduction.

To more readily understand and put into practical effect the present disclosure, particular aspects will now be described by way of examples and not limitations, and with reference to the drawings. For the sake of brevity, duplicate descriptions of features and properties may be omitted.

FIG. 1A shows a cross-sectional view of a semiconductor package according to an aspect of the present disclosure. In this illustration, it is shown a semiconductor package 100, e.g., a multichip package assembly, with an electrical shield 102. The cross-section is taken along the A-A' line of FIG. 1B.

The term "multichip package" generally refers to a semiconductor package that may include two or more chiplets that may be arranged laterally along the same plane. As different types of devices cater to different types of applications, more chiplets may be required in some systems to meet the requirements of high performance applications.

In FIG. 1A, the semiconductor package 100 may include a substrate 104. The substrate 104 may have solder balls, contact pads, electrical interconnects and routings, and other features, which may or may not be shown in any of the present figures and which are conventional features known to a person skilled in the art. Various couplings of the components may use conventional methods, including solder bonding, thermal compression bonding, or other metal diffusion method.

The semiconductor package 100 may further include an interposer 106 (e.g., a silicon interposer). The interposer 106 may be coupled to the substrate 104 via one or more solder bumps 108 at a landside surface. The interposer 106 may include a redistribution layer 110 on a top surface opposing the landside surface. The redistribution layer 110 may extend partially or fully along the top surface of the interposer 106. In the aspect shown in this figure, the redistribution layer 110 may extend fully along the top surface of the interposer 106. The redistribution layer 110 may comprise a plurality of metallization planes, which may be coupled to, for example, a reference voltage source. The interposer 106 may further include one or more through-silicon-vias (TSV) (112) therein, to provide a connection between the redistribution layer 110 and the substrate 104.

As shown in FIG. 1A, a first device 114 may be coupled to the interposer 106. The first device 114 may be a semiconductor device, such as a radio-frequency integrated circuit (RFIC), a bluetooth transceiver, or a WiFi device. The first device 114 may further include antenna 116 thereon. A first recess component 118, e.g., a chiplet including a central processing unit (CPU), a field programmable gate array (FPGA), or an application specific integrated circuit (ASIC), may be coupled to the interposer 106 close to or adjacent to the first device 114.

Optionally or additionally, a second recess component 120 may be coupled to the interposer 106 close to or adjacent to the first device 114. In the aspect shown in FIG. 1A, the first device 114 may be positioned or arranged between the first recess component 118 and the second recess component 120. The second recess component 120 may include a chiplet including a graphic processing unit (GPU), a platform controller hub (PCH), an I/O tile, an accelerator, or a memory device.

An improved signal integrity performance through shorter device-to-device transmission length and improved EMI and RF shielding between stacked chiplet devices on the interposer may be achieved through the use of an electrical shield with embedded components.

In an aspect shown in FIG. 1A, the electrical shield 102 may include a shield frame 122 (e.g., an organic-based frame including epoxy resin polymer materials). The shield frame 122 may have a first frame recess 140 and a second frame recess 142, and at least one opening or cavity 124. The shield frame 122 may be positioned over the interposer 106.

In various aspects, the first opening 124 may extend through a first frame surface 168 and an opposing second frame surface 170. The shield frame 122 may further include the first frame recess 140 extending from the second frame surface 170. In one aspect, the first frame recess 140 does not extend to the first frame surface 168 to form an opening.

Optionally or additionally, the shield frame 122 may further include the second frame recess 142 extending from the second frame surface 170. In one aspect, the second frame recess 142 does not extend to the first frame surface 168 to form an opening.

In various aspects, the semiconductor package 100 may further include a conductive shield layer 126 on the shield frame 122. In the aspect shown in FIG. 1A, the conductive shield layer 126 may cover, partially or completely, the surface of the shield frame 122 and may further extend over the frame recess(es) (140, 142) and the opening 124. For example, the conductive shield layer 126 may be coupled to a surface of the shield frame 122, extending over the first and second frame surfaces (168, 170), the opening 124, and the first and second frame recesses (140, 142).

In one aspect, the conductive shield layer 126 may be connected to a reference voltage (e.g., a power supply reference voltage (Vcc)) through, for example, the interposer 106. In other aspects, the shield layer 126 may be coupled to a ground reference voltage (Vss) through, for example, a frame support (to be described later).

In various aspects, the conductive shield layer 126 may be an electrically conductive layer. For example, the conductive shield layer 126 may be a single metal layer, such as a copper layer. In other examples, the conductive shield layer 126 may include a composite of metal layers, such as gold-coated copper or aluminum coated copper layers. Other metals or materials may also be suitable so long as they render the shield layer electrically conductive.

In an aspect, the conductive shield layer 126 may include a metal layer stack (not shown) with a dielectric layer isolating a first metal layer from a second metal layer. In an aspect, the first metal layer may be connected to a first reference voltage e.g., a ground reference voltage (Vss) and the second metal layer may be connected to a second reference voltage e.g., a power supply reference voltage (Vcc) through the interposer 106 and/or the frame support. In various aspects, the conductive shield layer 126 may have a thickness ranging from 10 μm to 200 μm.

The semiconductor package 100 may include a plurality of components (114, 118, 120, 128a, 128b, 128c, 128d) coupled to the interposer 106. In various aspects, the plurality of components may include active components, such as the first device 114, the first recess component 118, and the second recess component 120.

In various aspects, the plurality of components may include passive components, such as capacitors, resistors, inductors, and transformers. In one aspect, the passive components may be decoupling capacitors, including multi-layer ceramic capacitors or silicon capacitors. The plurality of passive components (128a, 128b, 128c, 128d) may be coupled to the second frame surface 170 and may be embedded within the shield frame 122. In an aspect where the conductive shield layer 126 may a single metal layer, one of the two decoupling capacitor terminals, e.g., a Vss terminal may be coupled to the conductive shield layer 126; the other terminal, e.g., a Vcc terminal may be spaced apart or isolated from the conductive shield layer (Vss) 126. In another aspect where the conductive shield layer may be a metal layer stack, e.g., including a first layer and a second layer, the Vss terminal of the decoupling capacitor may be coupled to the first layer associated to a ground reference voltage (Vss) and the Vcc terminal of the decoupling capacitor may be coupled to the second layer associated to a power supply reference voltage (Vcc). The first and second layers may be isolated or spaced apart by a dielectric layer. The decoupling capacitor may be further coupled to the PDN of the first device 114, the first recess component 118, and the second recess component 120 through the redistribution layer 110 coupled to the interposer 106. Improved PDN impedance and power supply noise may be achieved through shorter loop inductance between the stacked chiplets or device and the decoupling capacitor.

The efficiency of a decoupling component or capacitor to supply charges to an electronic device is inversely proportionate to the distance between the decoupling component and the electronic device. According to an aspect, the adjacency of decoupling components (i.e., embedded in the shield frame) results in a shorter distance (power inductance loop) compared to the conventional method (i.e., a connection traversing through silicon interposer and package substrate). Highly efficient decoupling capacitors allow the suppression of the power delivery impedance/noise profile, hence reducing signal jitter.

In addition, conventional capacitors require large contact pads that take up a significant real estate of the interposer. According to an aspect, by embedding the capacitors in the shield frame 122 and connecting through micro-vias 136 and solder bumps 138 to form a connection between the capacitors (128a, 128b, 128c, 128d) and the interposer 106, much real estate on the interposer 106 may be saved.

In various aspects, the first opening 124 may include a stepped or tapered opening surrounding the first device 114 to facilitate improved radio-frequency signal transmission and/or antenna reception.

The electrical shield 102 may be coupled to the interposer 106 and the substrate 104, extending over the first recess component 118 and the second recess component 120. In an aspect, the first device 114 may be disposed within the first opening 124, the first recess component 118 may reside within the first recess 140 and the second recess component 120 may reside within the second recess 142. An advantage of including this arrangement is to electrically isolate the first recess component 118 and the second recess component 120 from the first device 114 through the electrical shield 102.

In various aspects, the plurality of passive components (128a, 128b, 128c, 128d) may be adjacent to the first opening 124, the first and second recesses (140, 142) such that the first device 114 may be positioned or arranged between two passive components (128b, 128c), the first recess component 118 may be positioned or arranged between two passive components (128a, 128b), and the second recess component 120 may be positioned or arranged between two passive components (128c, 128d). The various passive components (128a, 128b, 128c, 128d) may be coupled to the first device 114, the first recess component 118, and the second recess component 120 through the interposer 106.

As shown in FIG. 1A, if an electrical shield is larger than its underlying interposer, an overhanging portion of the electrical shield 102 may be positioned over a frame support 130 (or stiffener, spacer, used interchangeably herein) coupled to the substrate 104. In an aspect, the frame support 130 may be positioned adjacent to the interposer 106 and provide level support for the electrical shield 102. The frame support 130 may facilitate a ground voltage connection between the substrate 104 and the electrical shield 102. In various aspects, the frame support 130 may include a metal sheet (e.g., a stainless steel or an aluminum sheet). In other aspects, the frame support 130 may be an organic-based mold layer. In one aspect, the electrical shield 102 may be electrically coupled to the substrate 104 through the frame support 130 and a conductive adhesive layer 132 disposed between the frame support 130 and the substrate 104. In various aspects, the frame support 130 may be integrally attached to the electrical shield 102. In an aspect, the frame support 130 may be coupled to a reference voltage plane e.g., a ground reference voltage (Vss) plane in the substrate 104 and/or the redistribution layer 110 coupled the interposer 106 through the conductive adhesive layer 132. In one aspect, an empty space may exist between the frame support 130 and interposer 106. In another aspect, an underfill material may be in contact with the frame support 130 and the interposer 106.

A thermal interface material 134a may be provided to aid thermal conduction between the first recess component 118 and the first recess 140. In one aspect, the thermal interface material 134a may be deposited on top of the first recess component 118 and are in contact with a surface (i.e., the second surface 170 of the shield frame 122) of the first recess 140, to aid in the thermal conduction. Alternatively, a thermal heat spreader may be used to aid in the thermal conduction from the first recess component 118.

In various aspects, the thermal interface material may include a polymer matrix, such as an epoxy or silicone resin, and thermally conductive fillers such as boron nitride, alumina, aluminum, zinc oxide, and silver. In an aspect, the thermal interface material may include a thermal paste, a thermal film/tape, a thermal adhesive, or a thermal grease.

In various aspects, the thermal heat spreader may include aluminum, aluminum alloys, copper, copper alloys.

Optionally or additionally, a thermal interface material 134b may be provided to aid thermal conduction between the second recess component 120 and the second recess 142. In one aspect, the thermal interface material 134b may be deposited on top of the second recess component 120 and are in contact with a surface (i.e., the second surface 170 of the shield frame 122) of the second recess 142, to aid in the thermal conduction. Alternatively, a thermal heat spreader may be used to aid in the thermal conduction from the second recess component 120. Suitable thermal interface material and thermal heat spreader may include those described above in reference to the thermal interface material 134a.

Figure 1B:
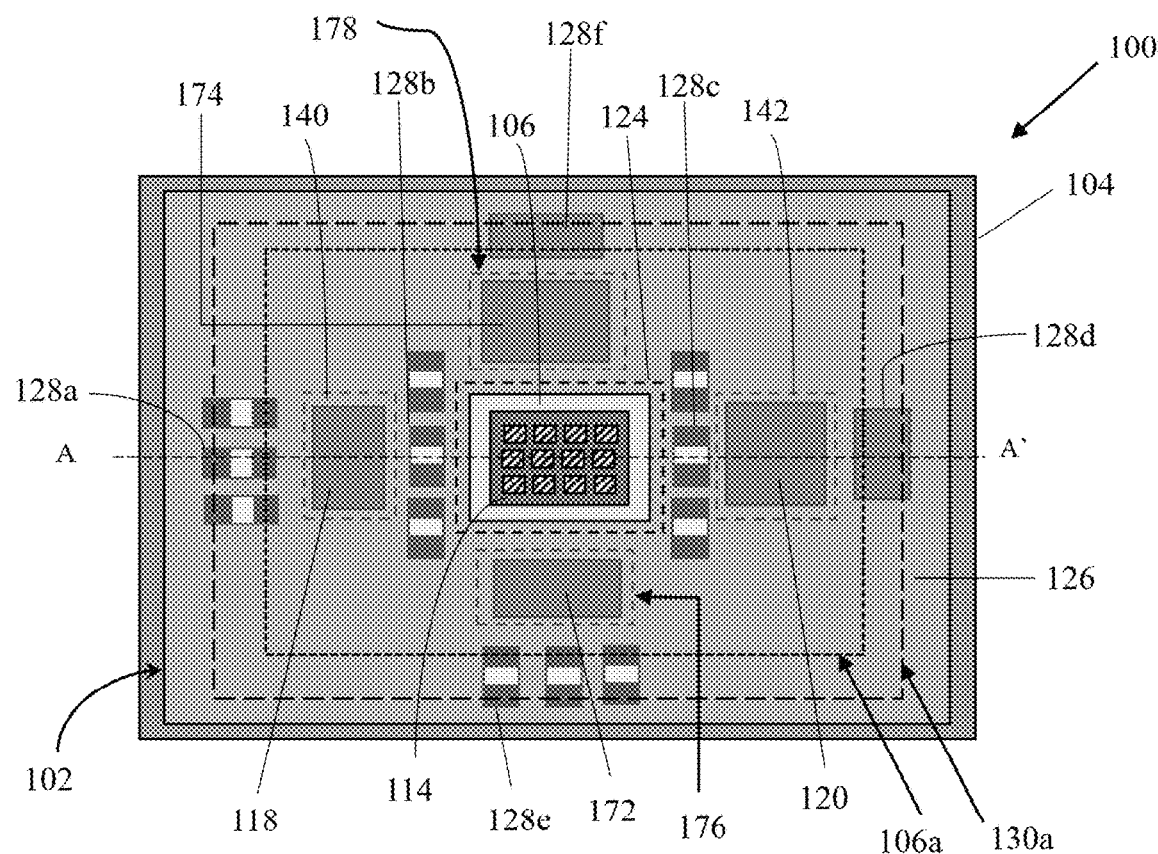
FIG. 1B shows a top view layout of the semiconductor package according to the aspect as shown in FIG. 1A.

FIG. 1B shows a top view layout of the semiconductor package 100 according to the aspect as shown in FIG. 1A. The substrate 104 may include a perimeter or footprint. The first device 114 may include a perimeter or footprint. The interposer 106 may include a perimeter or footprint 106a shown in a dashed line. The first opening 124 may include a perimeter or footprint, shown in a dashed line. The footprint of the first device 114 may fall within the footprint of the interposer 106a. The footprint of the first device 114 and the footprint of the first opening 124 may fall within the footprint of the interposer 106a.

In the aspect shown in FIG. 1B, the footprint of the first recess component 118 may fall within the footprint of the first recess 140 while the footprint of the second recess component 120 may fall within the footprint of the second recess 142.

FIG. 1B further shows a perimeter or footprint of the electrical shield 102. The footprints of the first device 114, first recess component 118, second recess component 120, and the plurality of passive components (128a, 128b, 128c, 128d) may fall within the footprint of the electrical shield 102.

FIG. 1B further shows the frame support 130 having an inner perimeter or footprint 130a (shown in a dashed line) that may be adjacent to the interposer 106. The frame support 130 may further include an outer perimeter or footprint (not shown) that may coincide with the perimeter of the electrical shield 102.

It should be understood that, according to the present disclosure, a semiconductor package may have a plurality of recess components and a plurality of embedded components that may need to be accommodated by an electrical shield. In the aspect shown in FIG. 1B, there may be further components, such as recess components (172, 174) falling within the footprint of respective recesses (176, 178) and passive components (128e, 128f), that may be coupled to the interposer 106 at various locations of the interposer 106. In addition, it should be understood that, according to the present disclosure, a semiconductor package may have further components that may need to be unshielded and further openings may need to be placed in an electrical shield.

Figure 2A:
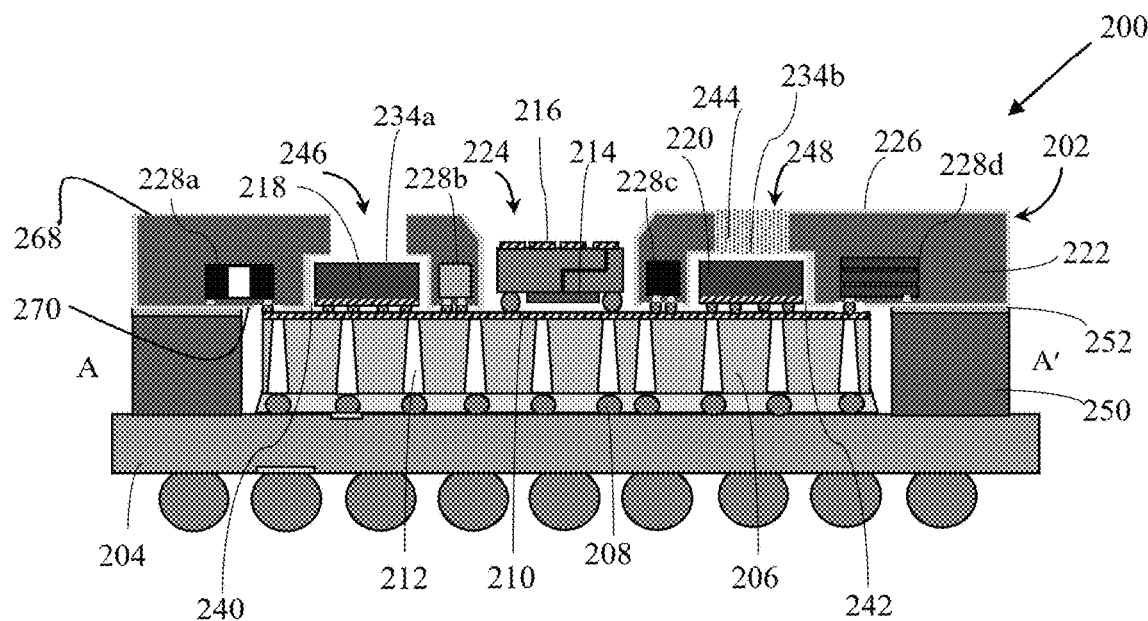
FIG. 2A shows a cross-sectional view of a semiconductor package according to another aspect of the present disclosure.

FIG. 2A shows a cross-sectional view of a semiconductor package 200 according to another aspect of the present disclosure, with openings formed through a first and second recess to facilitate thermal dissipation of a first and second recess components through a thermal interface material and/or thermal heat spreader. The cross-section is taken along the A-A' line of FIG. 2B. The semiconductor package 200 may be similar to the semiconductor package 100 of FIG. 1A and may include additional variations and components as described below.

In FIG. 2A, the semiconductor package 200 may include a substrate 204. The substrate 204 may have solder balls, contact pads, electrical interconnects and routings, and other features, which may or may not be shown in any of the present figures and which are conventional features known to a person skilled in the art. Various couplings of the components may use conventional methods, including solder bonding, thermal compression bonding, or other metal diffusion method.

The semiconductor package 200 may further include an interposer 206 (e.g., a silicon interposer). The interposer 206 may be coupled to the substrate 204 via one or more solder bumps 208 at a landside surface. The interposer 206 may include a redistribution layer 210 on a top surface opposing the landside surface. In the aspect shown in this figure, the redistribution layer 210 may extend fully along the top surface of the interposer 206. The redistribution layer 210 may extend partially or fully along the top surface of the interposer 206. The redistribution layer 210 may comprise a plurality of metallization planes, which may be coupled to, for example, a reference voltage source. The interposer 206 may further include one or more TSV (212) therein, to provide a connection between the redistribution layer 210 and the substrate 204.

As shown in FIG. 2A, a first device 214 may be disposed on the interposer 206. The first device 214 may be a semiconductor device, such as a radio-frequency integrated circuit (RFIC), a bluetooth transceiver, or a WiFi device. The first device 214 may further include antenna 216 thereon. A first recess component 218, e.g., a chiplet including a central processing unit (CPU), a field programmable gate array (FPGA), or an application specific integrated circuit (ASIC), may be coupled to the interposer 206 close to or adjacent to the first device 214.

Optionally or additionally, a second recess component 220 may be coupled to the interposer 206 close to or adjacent to the first device 214. In the aspect shown in FIG. 2A, the first device 214 may be positioned or arranged between the first recess component 218 and the second recess component 220. The second recess component 220 may include a chiplet including a graphic processing unit (GPU), a platform controller hub (PCH), an I/O tile, an accelerator or a memory device.

An improved signal integrity performance through shorter device-to-device transmission length and improved EMI and RF shielding between stacked chiplet devices on the interposer may be achieved through the use of an electrical shield with embedded components.

In an aspect shown in FIG. 2A, the electrical shield 202 may include a shield frame 222 (e.g., an organic-based frame including epoxy resin polymer materials). The shield frame 222 may have a first frame recess 240 and a second frame recess 242, and at least one opening or cavity 224. The shield frame 222 may be positioned over the interposer 206.

In various aspects, the first opening 224 may extend through a first frame surface 268 and an opposing second frame surface 270. The shield frame 222 may further include the first frame recess 240 extending from the second frame surface 270. In one aspect, the first frame recess 240 may extend to the first frame surface 268 to form a second opening 246.

Optionally or additionally, the shield frame 222 may further include the second frame recess 242 extending from the second frame surface 270. In one aspect, the second frame recess 242 may extend to the first frame surface 268 to form a third opening 248.

In various aspects, the semiconductor package 200 may further include a conductive shield layer 226 on the shield frame 222. In the aspect shown in FIG. 2A, the conductive shield layer 226 may cover partially or completely, the surface of the shield frame 222 and may further extend over the frame recess(es) (240, 242), the first, second, and third openings (224, 246, 248). For example, the conductive shield layer 226 may be coupled to a surface of the shield frame 222, extending over the first and second frame surfaces (268, 270), the openings (224, 246, 248) and the first and second frame recesses (240, 242).

In one aspect, the conductive shield layer 226 may be connected to a reference voltage (e.g., a power supply reference voltage (Vcc)) through, for example, the interposer 206. In other aspects, the shield layer 226 may be coupled to a ground reference voltage (Vss) through, for example, a frame support (to be described later).

In various aspects, the conductive shield layer 226 may be an electrically conductive layer. For example, the conductive shield layer 226 may be a single metal layer, such as a copper layer. In other examples, the conductive shield layer 226 may include a composite of metal layers, such as gold-coated copper or aluminum coated copper layers. Other metals or materials may also be suitable so long as they render the shield layer electrically conductive.

In an aspect, the conductive shield layer 226 may include a metal layer stack (not shown) with a dielectric layer isolating a first metal layer from a second metal layer. In an aspect, the first metal layer may be connected to a first reference voltage e.g., a ground reference voltage (Vss) and the second metal layer may be connected to a second reference voltage e.g., a power supply reference voltage (Vcc) through the interposer 106 and/or the frame support. In various aspects, the conductive shield layer 226 may have a thickness ranging from 10 μm to 200 μm.

The semiconductor package 200 may further include a plurality of components (214, 218, 220, 228a, 228b, 228c, 228d) coupled to the interposer 206. In various aspects, the plurality of components may include active components, such as the first device 214, the first recess component 218, and the second recess component 220.

In various aspects, the plurality of components may also be passive components such as capacitors, resistors, inductors, and transformers. In one aspect, the passive components may be decoupling capacitors, including multi-layer ceramic capacitors or silicon capacitors. The plurality of passive components (228a, 228b, 228c, 228d) may be coupled to the second frame surface 270 and may be embedded within the shield frame 222. In an aspect where the conductive shield layer may be a single metal layer, one of the two capacitor terminals, e.g., a Vss terminal may be coupled to the conductive shield layer 226; the other terminal, e.g., a Vcc terminal may be spaced apart or isolated from the conductive shield layer (Vss) 226. In another aspect where the conductive shield layer 226 may be a metal layer stack, e.g., including a first layer and a second layer, the Vss terminal of the decoupling capacitor may be coupled to the first layer associated to a ground reference voltage (Vss) and the Vcc terminal of the decoupling capacitor may be coupled to the second layer associated to a power supply reference voltage (Vcc). The first and second layers may be isolated or spaced apart by a dielectric layer on the shield frame 222. The decoupling capacitor may be further coupled to the power delivery network (PDN) of the first device 214, the first chiplet 218, and the second chiplet 220 through the redistribution layer 210 coupled to the interposer 206.

In various aspects, the first cavity 224 may include a stepped or tapered opening surrounding the first device 214 to facilitate improved radio-frequency signal transmission and/or antenna reception.

The electrical shield 202 may be coupled to the interposer 206 and the substrate 204, extending over the first recess component 218 and the second recess component 220. In an aspect, the first device 214 may be disposed within the first cavity 224, the first recess component 218 may reside within the first recess 240 and the second recess component 220 may reside within the second recess 242. An advantage of including this arrangement is to electrically isolate the first recess component 218 and second recess component 220 from the first device 214 through the electrical shield 202.

In various aspects, the plurality of passive components (228a, 228b, 228c, 228d) may be adjacent to the first opening 224, the first and second recesses (240, 242) such that the first device 214 may be positioned or arranged between two passive components (228b, 228c), the first recess component 218 may be positioned or arranged between two passive components (228a, 228b), and the second recess component 220 may be positioned or arranged between two passive components (228c, 228d). The various passive components (228a, 228b, 228c, 228d) may be coupled to the first device 214, the first recess component 218, and the second recess component 220 through the interposer 206.

As shown in FIG. 2A, if an electrical shield is larger than its underlying interposer, an overhanging portion of the electrical shield 202 may be positioned over a frame support 250 coupled to the substrate 204. The frame support 250 disposed on the surface of the substrate 204 may provide mechanical support to the package for warpage control and at the same time act as a spacer to mechanically support the shield frame 222, which may be coupled through an adhesive layer 252. The frame support 250 may be non-electrically conductive; for example, an organic-based mold layer.

A thermal interface material 234a may be provided to aid thermal conduction between the first recess component 218 and the first recess 240. In one aspect, the thermal interface material 234a may be deposited on top of the first recess component 218 and are exposed to the second opening 246, to aid in the thermal conduction. Alternatively, a thermal heat spreader may be used to aid in the thermal conduction from the first recess component 218.

In various aspects, the thermal interface materials may include a polymer matrix, such as an epoxy or silicone resin, and thermally conductive fillers such as boron nitride, alumina, aluminum, zinc oxide, and silver. In an aspect, the thermal interface material may include a thermal paste, a thermal film/tape, a thermal adhesive, or a thermal grease.

In various aspects, the thermal heat spreader may include aluminum, aluminum alloys, copper, copper alloys.

Optionally or additionally, a thermal interface material 234b may be provided to aid thermal conduction between the second recess component 220 and the second recess 242. In one aspect, the thermal interface material 234b may be deposited on top of the second recess component 220 and are exposed to the third opening 248, to aid in the thermal conduction. In another aspect as shown in FIG. 2A, a further thermal interface material 244 may be deposited on the thermal interface material 234b to provide a more efficient thermal conduction. In an aspect, the further thermal interface materials 244 may include one or more liquid cooling channels and/or heat pipes. Suitable thermal interface material and thermal heat spreader may include those described above in reference to the thermal interface material 234a.

Figure 2B:
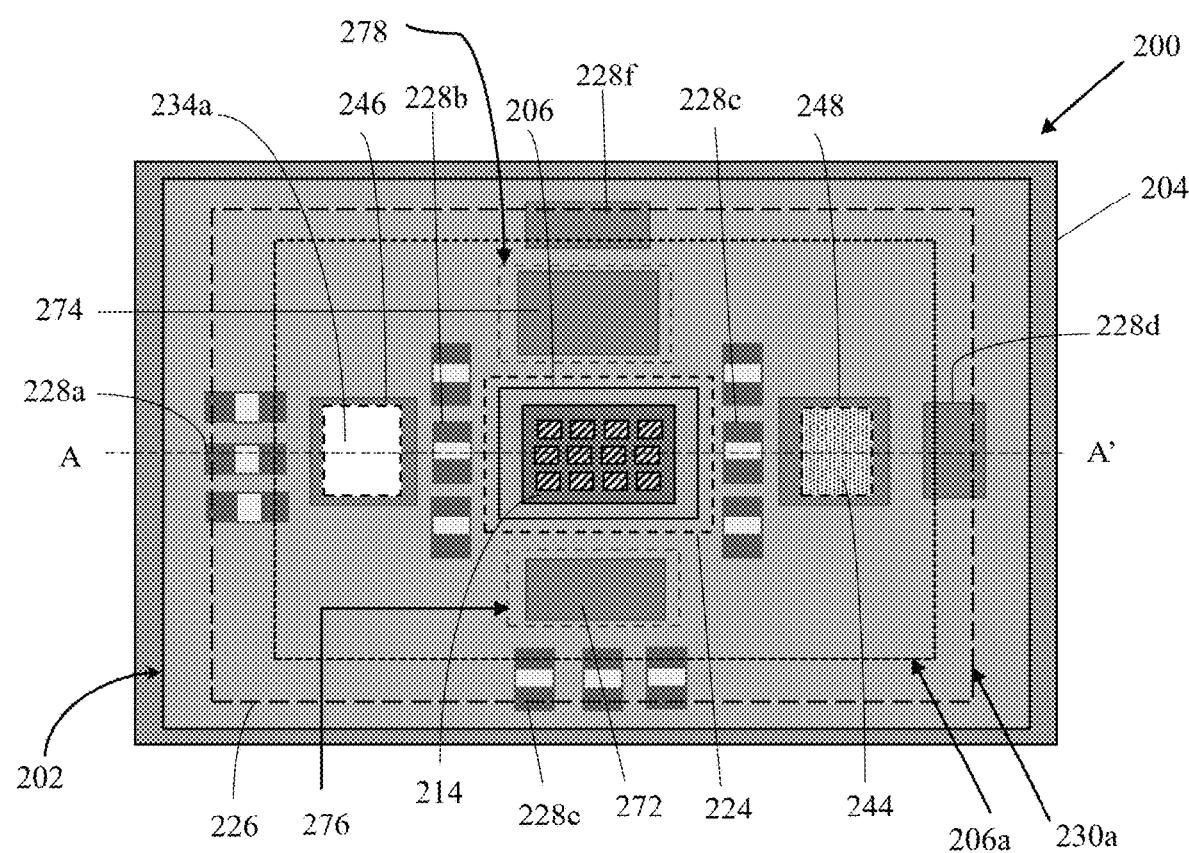
FIG. 2B shows a top view layout of the semiconductor package according to the aspect as shown in FIG. 2A.

FIG. 2B shows a top view layout of the semiconductor package 200 according to the aspect as shown in FIG. 2A. The substrate 204 may include a perimeter or footprint. The first device 214 may include a perimeter or footprint. The interposer 206 may include a perimeter or footprint. The first opening 224 may include a perimeter or footprint, shown in a dashed line. The footprint of the first device 214 may fall within the footprint of the interposer 206. The footprint of the first device 214 and the footprint of the first cavity 224 may fall within the footprint of the interposer 206.

In the aspect shown in FIG. 2B, the footprint of the thermal interface materials 234a may fall within the footprint of the second opening 246 while the footprint of the further thermal interface material 244 may fall within the footprint of the third opening 248.

FIG. 2B further shows a perimeter or footprint of the electrical shield 202. The footprints of the first device 214, thermal interface materials 234a, further thermal interface material 244, and the plurality of passive components (228a, 228b, 228c, 228d) may fall within the footprint of the electrical shield 202.

FIG. 2B further shows the frame support 230 having an inner perimeter or footprint 230a (shown in a dashed line) that may be adjacent to the interposer 206. The frame support 230 may further include an outer perimeter or footprint (not shown) that may coincide with the perimeter of the electrical shield 202.

In the aspect shown in FIG. 2B, there may be further components, such as recess components (272, 274) falling within the footprint of respective recesses (276, 278) and passive components (228e, 228f), that may be coupled to the interposer 206 at various locations of the interposer 206. Similar to the first recess component 218 or the second recess component 220, the further recess components (272, 274) may be provided with thermal interface material or thermal heat spreader, or may be exposed to an opening.

It should be understood that, according to the present disclosure, a semiconductor package may have a plurality of recess components and a plurality of embedded components that may need to be accommodated by an electrical shield. In the aspect shown in FIG. 2B, there may be further components, such as recess components (272, 274) falling within the footprint of respective recesses (276, 278) and passive components (228e, 228f), that may be coupled to the interposer 206 at various locations of the interposer 206. In addition, it should be understood that, according to the present disclosure, a semiconductor package may have further components that may need to be unshielded and further openings may need to be placed in an electrical shield.

FIGS. 3A through 3I show cross-sectional views directed to an exemplary simplified process flow for forming a 2.5 D heterogenous stacked semiconductor package 300, according to an aspect that is generally similar to that shown in FIG. 1A of the present disclosure, and an electrical shield 302.

Figure 3A:
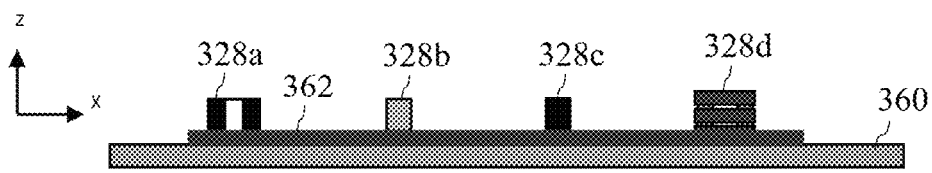
FIGS. 3A through 3I show cross-sectional views directed to an exemplary simplified process flow for a method for forming a semiconductor package according to an aspect that is generally similar to that shown in FIG. 1A of the present disclosure.

FIG. 3A shows a carrier 360, onto which a first mold layer 362 may be deposited. A plurality of passive components (328a, 328b, 328c, 328d) may be disposed on the first molder layer 362. Conventional techniques may be employed, such as but not limited to, an injection, a compression, or a transfer molding process.

Figure 3B:
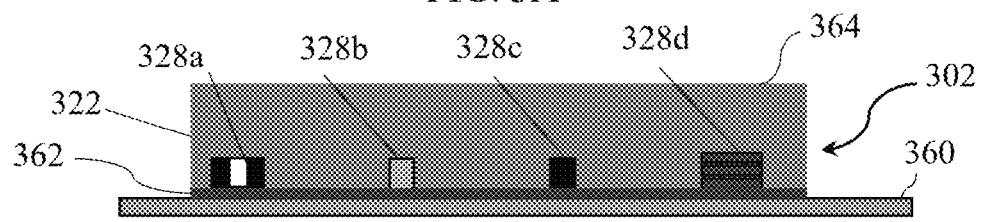

FIG. 3B shows the deposition of a second mold layer 364 over the first mold layer 362 to form a shield frame 322 and the positioning of a plurality of passive components (328a, 328b, 328c, 328d) that may be embedded in the electrical shield 302. Conventional techniques may be employed, such as, but not limited to, an injection, a compression, or a transfer molding process.

Figure 3C:
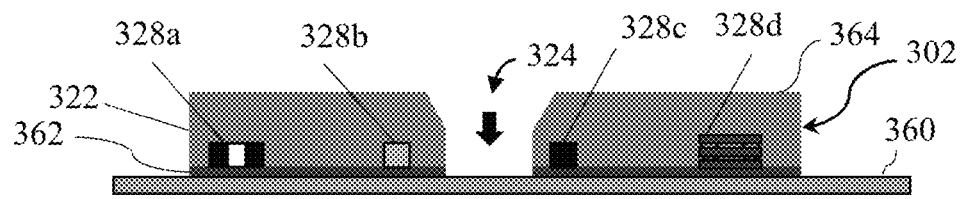

FIG. 3C shows the removal of a portion of the second mold layer 364 and the first mold layer 362 to form the first opening 324, which has a taper. A conventional mechanical or laser drilling process may be employed.

Figure 3D:
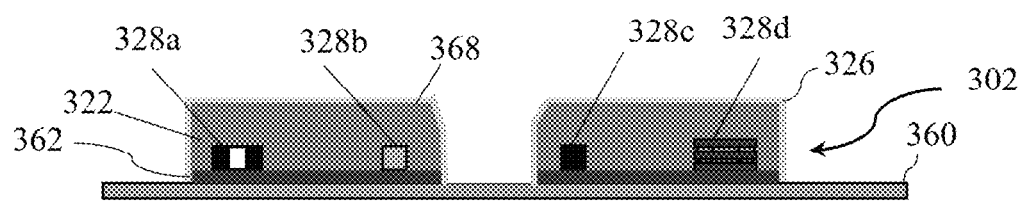

FIG. 3D shows the formation of a first portion of a conductive shield layer 326 on a first frame surface 368. The formation process may be carried out by an electroless or electrolytic plating process.

Figure 3E:
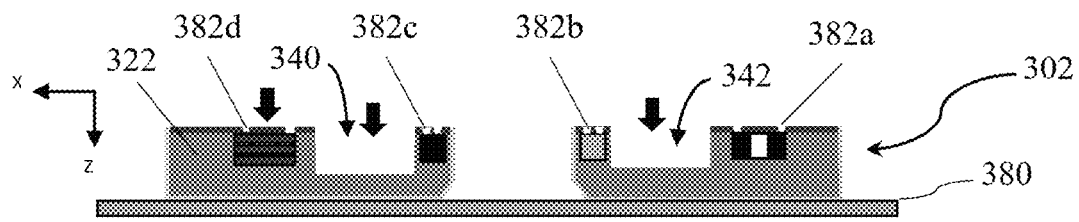

FIG. 3E shows the electrical shield 302 removed from the carrier 360 and placed on a second carrier 380 and the removal of portions of the shield frame 322 to form the first recess 340 and the second recess 342, and exposing the passive component contact pads (382a, 382b, 382c, 382d). Conventional techniques may be employed, such as, but not limited to, mechanical or laser drilling process.

Figure 3F:
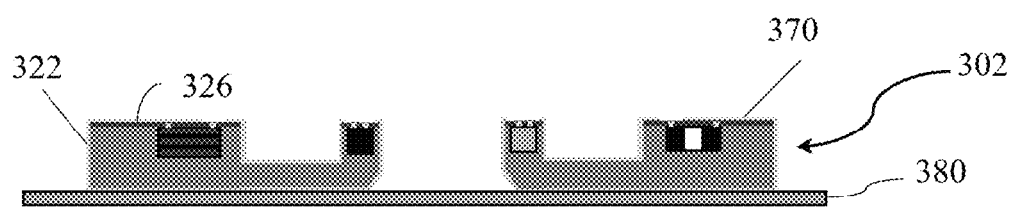

FIG. 3F shows the formation of a second portion of the conductive shield layer 326 over the first and second recesses 340 and 342, respectively, and a second frame surface 370. Conventional techniques may be employed, such as, but not limited to, electroless or electrolytic plating process.

Figure 3G:
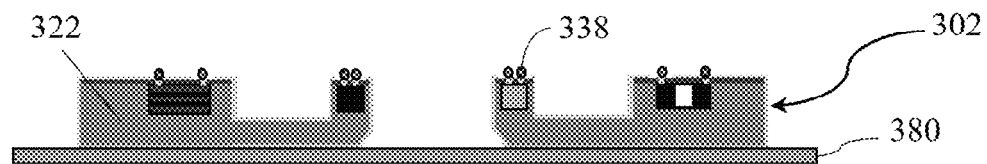

FIG. 3G shows the attachment of solder bumps 338 on the passive component contact pads (382a, 382b, 382c, 382d). Conventional techniques may be employed, such as stencil printing or solder reflow process.

Figure 3H:
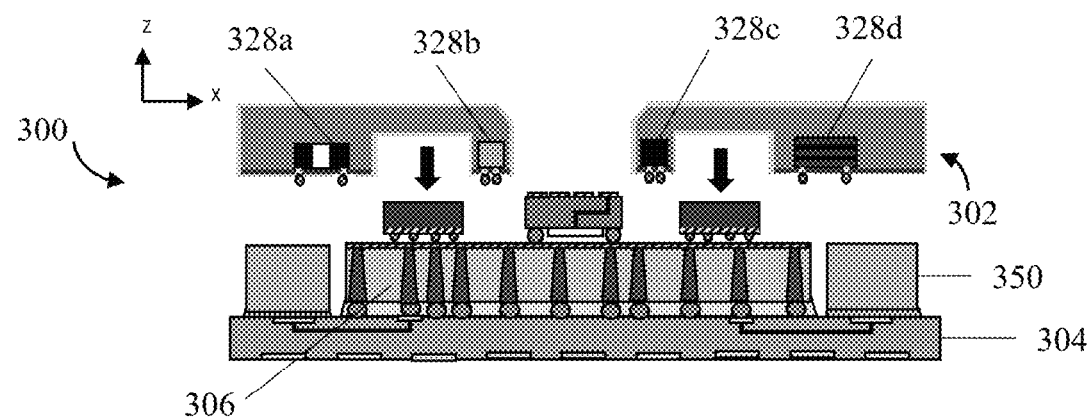

FIG. 3H shows positioning of the electrical shield 302 over an interposer 306 and frame support 350, which have been positioned on a substrate 304, to align the frame recesses 340 and 342 and the opening 324 with a plurality of components coupled onto the interposer 306. The electrical shield 302, together with the plurality of passive components (328a, 328b, 328c, 328d) embedded therein, is attached to complete the 2.5 D heterogenous stacked semiconductor package 300. The attachment may be carried out by, for example, a thermal compression bonding or a solder reflow process.

Figure 3I:
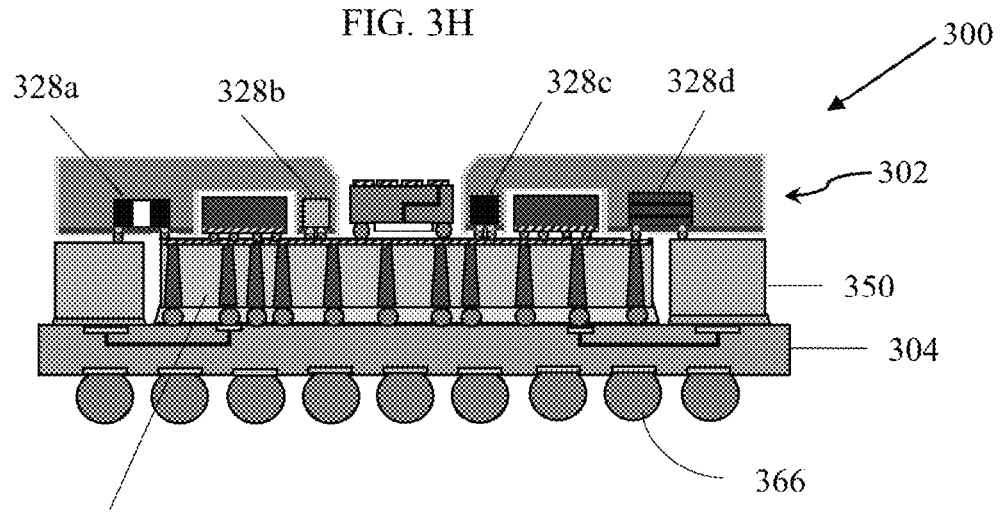

FIG. 3I shows the attachment of solder balls 366 on a landside of the 2.5 D heterogenous stacked package 300 by conventional processes, e.g., solder reflow process.

Figure 4:
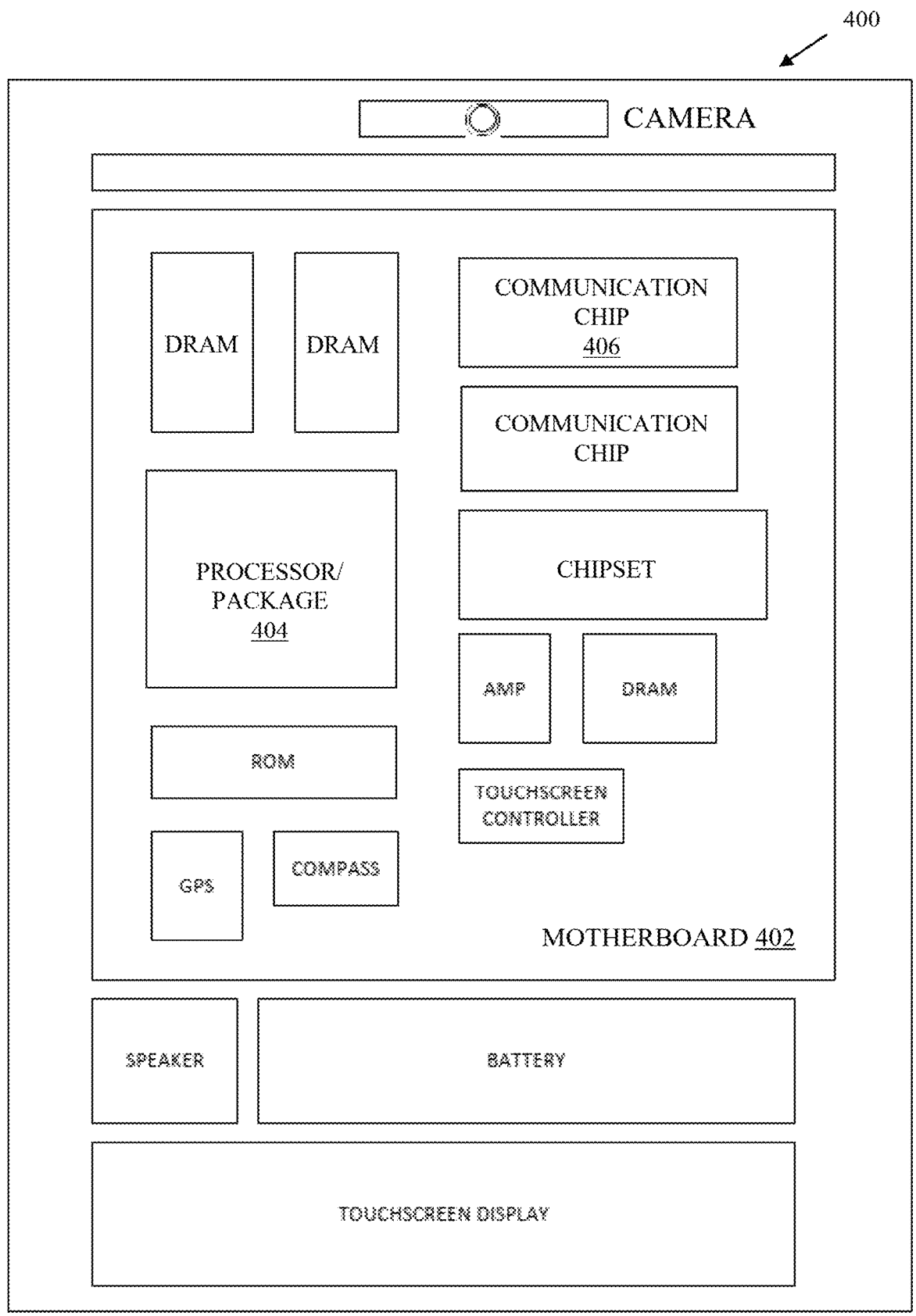
FIG. 4 shows an illustration of a computing device that includes a semiconductor package according to a further aspect of the present disclosure.

Aspects of the present disclosure may be implemented into a system using any suitable hardware and/or software. FIG. 4 schematically illustrates a computing device 400 that may include a semiconductor package as described herein, in accordance with some aspects. The computing device 400 may house a board such as a motherboard 402. The motherboard 402 may include a number of components, including but not limited to a processor 404 and at least one communication chip 406. The processor 404, which may have a semiconductor package according to the present disclosure, may be physically and electrically coupled to the motherboard 402. In some implementations, the at least one communication chip 406 may also be physically and electrically coupled to the motherboard 402. In further implementations, the communication chip 406 may be part of the processor or package 404.

Depending on its applications, computing device 400 may include other components that may or may not be physically and electrically coupled to the motherboard 402. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 406 may enable wireless communications for the transfer of data to and from the computing device 400. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 406 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 406 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 406 may operate in accordance with other wireless protocols in other aspects.

The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 400 may be a mobile computing device. In further implementations, the computing device 400 may be any other electronic device that processes data.

Figure 5:
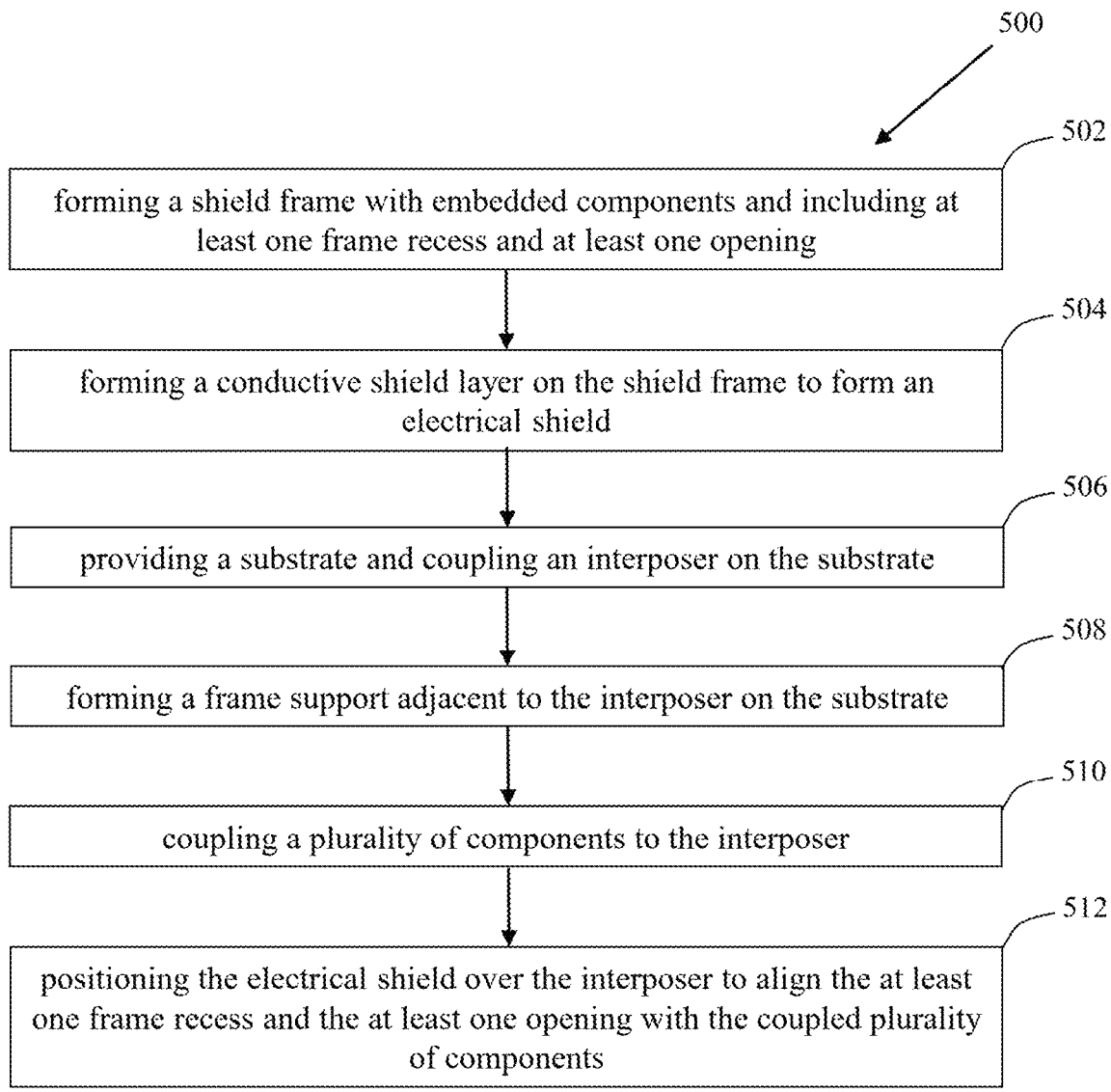
FIG. 5 shows a flow chart illustrating a method for forming a semiconductor package according to an aspect of the present disclosure.

FIG. 5 shows a flow chart illustrating a method 500 of forming a semiconductor package according to an aspect of the present disclosure.

As shown in FIG. 5, at operation 502, the method 500 of forming a semiconductor package may include forming a shield frame with embedded components and having at least one frame recess and at least one opening.

At operation 504, the method may include forming a conductive shield layer on the shield frame to form an electrical shield.

At operation 506, the method may include providing a substrate and coupling an interposer on the substrate.

At operation 508, the method may include forming a frame support adjacent to the interposer on the substrate.

At operation 510, the method may include coupling a plurality of components to the interposer.

At operation 512, the method may include positioning the electrical shield over the interposer to align the at least one frame recess and the at least one opening with the coupled plurality of components.

It will be understood that the above operations described above relating to FIG. 5 are not limited to this particular order. Any suitable, modified order of operations may be used.

Examples

Example 1 may include a semiconductor package including a substrate; an interposer coupled to the substrate; a shield frame including at least one frame recess and at least one opening positioned over the interposer; a conductive shield layer on the shield frame; and a plurality of components coupled to the interposer.

Example 2 may include the semiconductor package of example 1 and/or any other example disclosed herein, wherein the plurality of components further includes at least one recess component positioned in the frame recess; at least a first semiconductor device positioned in the opening; and at least one embedded component embedded in the shield frame.

Example 3 may include the semiconductor package of example 2 and/or any other example disclosed herein, wherein the at least one embedded component further includes a first embedded component and a second embedded component and the first semiconductor device is arranged between the first and second embedded components.

Example 4 may include the semiconductor package of example 3 and/or any other example disclosed herein, wherein the recess component is arranged between the first and second embedded components.

Example 5 may include the semiconductor package of example 1 and/or any other example disclosed herein, further including a frame support positioned adjacent to the interposer over the substrate, wherein the shield frame is positioned over the interposer and the frame support.

Example 6 may include the semiconductor package of example 5 and/or any other example disclosed herein, further including an electrical connection between the shield frame and the substrate formed in the frame support.

Example 7 may include the semiconductor package of example 5 and/or any other example disclosed herein, wherein the frame support is made of non-electrically conducting material.

Example 8 may include the semiconductor package of example 5 and/or any other example disclosed herein, wherein the frame support is integrally attached to the shield frame.

Example 9 may include the semiconductor package of example 1 and/or any other example disclosed herein, wherein the conductive shield layer covers, partially or completely, a surface of the shield frame and extends over the frame recess and the opening.

Example 10 may include the semiconductor package of example 1 and/or any other example disclosed herein, wherein the conductive shield layer further includes one or more metal layers.

Example 11 may include the semiconductor package of example 2 and/or any other example disclosed herein, further including at least one of a thermal interface layer and/or a thermal heat spreader being placed on the recess component.

Example 12 may include the semiconductor package of example 11 and/or any other example disclosed herein, wherein the thermal interface layer and/or the thermal heat spreader further comprises a polymer matrix, a thermally conductive filler, a metal, or a metal alloy.

Example 13 may include the semiconductor package of example 2 and/or any other example disclosed herein, wherein the opening further includes a stepped or a tapered opening surrounding the first semiconductor device.

Example 14 may include a computing device including a circuit board; and a semiconductor package coupled to the circuit board, the semiconductor package including a substrate; an interposer coupled to the substrate; a shield frame including at least one frame recess and at least one opening positioned over the interposer; a conductive shield layer on the shield frame; and a plurality of components coupled to the interposer.

Example 15 may include the computing device of example 14 and/or any other example disclosed herein, wherein the plurality of components further includes: at least one recess component positioned in the frame recess; at least a first semiconductor device positioned in the opening; and at least one embedded component embedded in the shield frame.

Example 16 may include the computing device of example 14 and/or any other example disclosed herein, further including a frame support positioned adjacent to the interposer over the substrate, wherein the shield frame is positioned over the interposer and the frame support.

Example 17 may include the computing device of example 15 and/or any other example disclosed herein, wherein the conductive shield layer covers, partially or completely, a surface of the shield frame and extends over the frame recess and the opening.

Example 18 may include a method including forming a shield frame comprising at least one frame recess and at least one opening; forming a conductive shield layer on the shield frame; providing a substrate; coupling an interposer to the substrate; coupling a plurality of active components to the interposer; and positioning the shield frame over the interposer to align the at least one frame recess and the at least one opening with the coupled plurality of components.

Example 19 may include the method of example 18 and/or any other example disclosed herein, further including forming a frame support adjacent to the interposer positioned over the substrate, wherein the shield frame is positioned over the interposer and the frame support.

Example 20 may include the method of example 18 and/or any other example disclosed herein, wherein forming the shield frame further includes forming a first layer of shield frame material; positioning a plurality of passive components on the first layer of shield frame material; and forming a second layer of shield frame material over the first layer of the shield frame material and the plurality of passive components.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor package comprising:
    a substrate;
    an interposer, comprising a first side and a second side, opposite the first side, wherein the first side is coupled to the substrate;
    a shield frame, comprising a third side and a fourth side, opposite the third side, wherein at least a position of the third side is positioned on the second side of the interposer, and comprising at least one frame recess in the third side of the shield frame and at least one opening, distinct from the at least one frame recess, wherein the at least one opening extends from a portion of the third side through a portion of the fourth side of the shield frame;
    a conductive shield layer on the fourth side of the shield frame; and
    a plurality of components coupled to the interposer;
    at least one recess component positioned on the interposer in the frame recess;
    at least a first semiconductor device positioned in the opening; and
    at least one embedded component embedded in the shield frame;
    wherein the conductive shield layer covers, partially or completely, a surface of the shield frame and extends over the frame recess and the opening.

2. The semiconductor package of claim 1, wherein the at least one embedded component further comprises a first embedded component and a second embedded component and the first semiconductor device is arranged between the first and second embedded components.

3. The semiconductor package of claim 2, wherein the recess component is arranged between the first and second embedded components.

4. The semiconductor package of claim 1, further comprising:
    a frame support positioned adjacent to the interposer over the substrate, wherein the shield frame is positioned over the interposer and the frame support.

5. The semiconductor package of claim 4, further comprising:
    an electrical connection between the shield frame and the substrate formed in the frame support.

6. The semiconductor package of claim 4, wherein the frame support is made of non-electrically conducting material.

7. The semiconductor package of claim 4, wherein the frame support is integrally attached to the shield frame.

8. The semiconductor package of claim 1, wherein the conductive shield layer further comprises one or more metal layers.

9. The semiconductor package of claim 1, further comprising at least one of a thermal interface layer and/or a thermal heat spreader being placed on the recess component.

10. The semiconductor package of claim 9, wherein the thermal interface layer and/or the thermal heat spreader further comprises a polymer matrix, a thermally conductive filler, a metal, or a metal alloy.

11. The semiconductor package of claim 1, wherein the opening further comprises a stepped or a tapered opening surrounding the first semiconductor device.

12. The semiconductor package of claim 1, wherein the at least one recess component comprises a chiplet comprising a central processing unit (CPU), a field programmable gate array (FPGA), or an application specific integrated circuit (ASIC).

13. A computing device comprising:
a circuit board; and
a semiconductor package coupled to the circuit board, the semiconductor package comprising:
a substrate;
an interposer, comprising a first side and a second side, opposite the first side, wherein the first side is coupled to the substrate;
a shield frame, comprising a third side and a fourth side, opposite the third side, wherein at least a position of the third side is positioned on the second side of the interposer, and comprising at least one frame recess in the third side of the shield frame and at least one opening, distinct from the at least one frame recess, wherein the at least one opening extends from a portion of the third side through a portion of the fourth side of the shield frame;
a conductive shield layer on the fourth side of the shield frame; and
a plurality of components coupled to the interposer;
at least one recess component positioned on the interposer in the frame recess;
at least a first semiconductor device positioned in the opening; and
at least one embedded component embedded in the shield frame;
wherein the conductive shield layer covers, partially or completely, a surface of the shield frame and extends over the frame recess and the opening.

14. The computing device of claim 13, further comprising:
a frame support positioned adjacent to the interposer over the substrate, wherein the shield frame is positioned over the interposer and the frame support.

15. The computing device of claim 13, wherein the conductive shield layer covers, partially or completely, a surface of the shield frame and extends over the frame recess and the opening.

16. The computing device comprising of claim 13, wherein the at least one recess component of the semiconductor package comprises a chiplet comprising a central processing unit (CPU), a field programmable gate array (FPGA), or an application specific integrated circuit (ASIC).

* * * * *